United States Patent
Barnard et al.

[11] Patent Number: 5,919,580
[45] Date of Patent: Jul. 6, 1999

[54] SPIN VALVE DEVICE CONTAINING A CR-RICH ANTIFERROMAGNETIC PINNING LAYER

[75] Inventors: John A Barnard; Timothy J. Klemmer; Venkateswara Inturi, all of Tuscaloosa, Ala.

[73] Assignee: University of Alabama, Tuscaloosa, Ala.

[21] Appl. No.: 08/861,754

[22] Filed: May 22, 1997

[51] Int. Cl.⁶ .................................................. G11B 5/39
[52] U.S. Cl. ........................ 428/692; 428/667; 428/928; 360/113; 324/252; 338/32 R
[58] Field of Search .................... 428/692, 667, 428/928; 324/252; 338/32 R; 360/113

[56] References Cited

U.S. PATENT DOCUMENTS

| | | | |
|---|---|---|---|
| 5,301,079 | 4/1994 | Cain et al. | 360/113 |
| 5,436,777 | 7/1995 | Soeya et al. | 360/113 |
| 5,477,482 | 12/1995 | Prinz | 365/129 |
| 5,541,868 | 7/1996 | Prinz | 365/98 |

*Primary Examiner*—Stevan A. Resan
*Attorney, Agent, or Firm*—Oblon, Spivak, McClelland, Maier & Neustadt, P.C.

[57] ABSTRACT

A spin valve device containing a chromium or chromium and aluminum antiferromagnetic layer, which acts as a pinning layer for a magnetoresistive ferromagnetic layer, by exchange coupling. The antiferromagnetic layer has a tunable Néel temperature and anisotropy constant, and is corrosion resistant.

18 Claims, 4 Drawing Sheets

SPIN VALVE DEVICE CONTAINING A CR-RICH ANTIFERROMAGNETIC PINNING LAYER

The U.S. Government may have certain rights to this invention through contract No. NSF-DMR-9400399.

BACKGROUND OF THE INVENTION

1. Field of the Invention

The present invention relates to a spin valve device containing a chromium-rich antiferromagnetic thin film which pins a magnetoresistive ferromagnetic thin film through exchange coupling.

2. Description of the Background

Exchange-biased spin valve multilayers are a class of metallic multilayer materials which display the giant magnetoresistive (GMR) effect. Recently, spin valves have received increasing attention for application in magnetoresistive sensors, most notably in read heads for hard disk (HD) and tape magnetic storage devices, where they provide greater sensitivities as compared to read heads based on conventional anisotropic magnetoresistive materials. For a discussion of spin valve devices see J. C. S. Kools, "Exchange-Biased Spin Valves For Magnetic Storage", IEEE Transactions on Magnetics, Vol. 32, no. 4, July, 1996, p. 3165–3184, incorporated herein by reference. For a description of using spin valves and related devices for magnetic recording applications, see U.S. Pat. Nos. 5,301,079, 5,436,777 and 5,471,358.

Exchange induced unidirectional anisotropy has been observed in a variety of bilayer systems, such as Ni—Fe/Fe—Mn[2], Ni—Fe/NiO and Ni—Fe/Co—Ni—O[5], Ni—Fe/Ni—Mn[6], and Ni—Fe/$\alpha$Fe$_2$O$_3$ and Ni—Fe/Tb—Co[7]. Fe—Mn (50/50) has a disordered fcc structure and is the most extensively studied antiferromagnetic film, followed by the oxides of Co and Ni. The equilibrium structure of FeMn is the so-called $\alpha$-phase, which is bcc. Therefore, a lattice-matched underlayer is often required to stabilize the antiferromagnetic fcc phase[3]. TbCo is amorphous and little work has been done on this alloy. Nearly equiatomic Ni—Mn is known to be antiferromagnetic only in the CuAu—I—type (L1$_0$) ordered structure[8]. Therefore, Ni—Mn films sputtered at ambient temperature, which are usually disordered fcc, require annealing to enhance exchange coupling[6, 9]. In addition, FeMn and TbCo are known to be very sensitive to corrosion, which is unacceptable for technological applications.

Accordingly, there remains a need for spin valve devices which overcome these disadvantages.

SUMMARY OF THE INVENTION

It is an object of the present invention to provide a spin valve device containing an antiferromagnetic pinning layer which has a tunable Néel temperature and anisotropy constant.

It is another object of this invention to provide a a spin valve device containing an antiferromagnetic pinning layer which has improved corrosion resistance.

The above objects and others may be accomplished with a spin valve device containing:

an antiferromagnetic pinning layer comprising chromium and aluminum; and a pinned magnetoresistive ferromagnetic layer on the pinning layer.

The above objects may also be accomplished with a spin valve device containing:

an antiferromagnetic pinning layer consisting essentially of chromium and, optionally, aluminum; and a pinned magnetoresistive ferromagnetic layer on the pinning layer.

NM 6 represents a non-magnetic spacer layer; and F$_1$ 8 and F$_2$ 10 represent two different magnetoresistive ferromagnetic layers. (A) top spin valve; (B) bottom spin valve; (C) spin valve with two different magnetoresistive ferromagnetic layers; (D) interface engineered spin valve; (E) symmetric spin valve.

FIG. 2. Hysteresis loops for (A) FeTaN and (B) NiFe coupled to Cr—Al.

FIG. 3. Exchange field and coercivity of the coupled bilayers plotted against the inverse of the (A) FeTaN and (B) NiFe film thickness.

Figure 4:
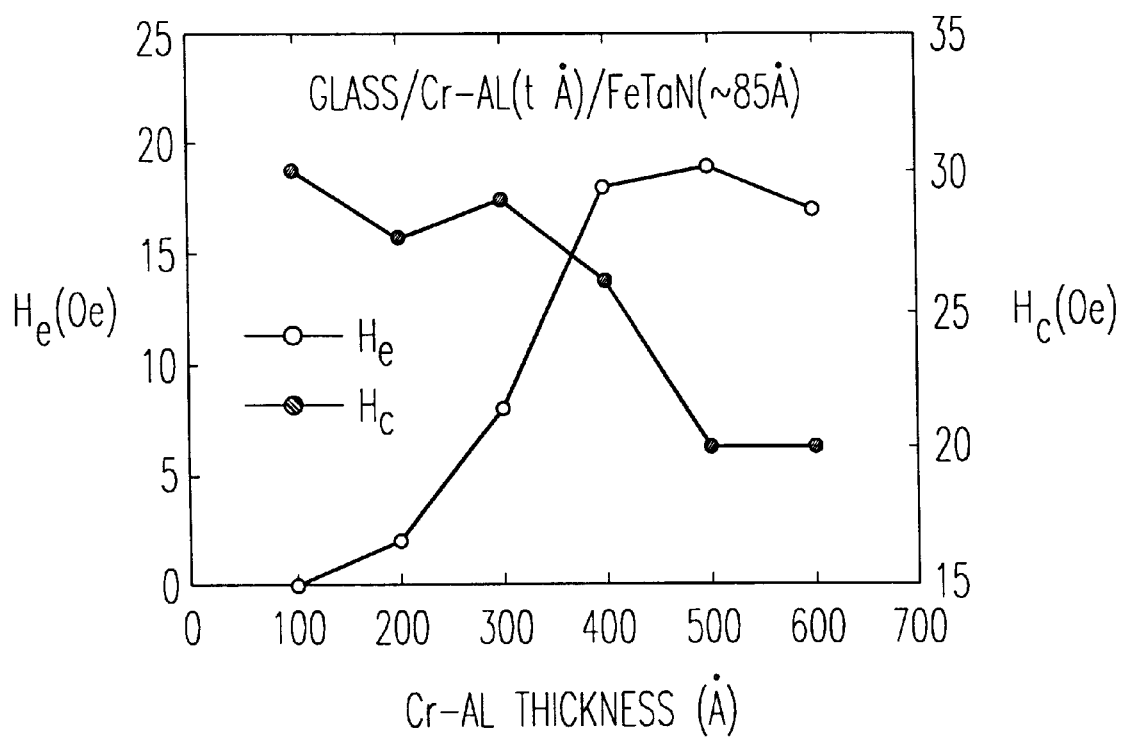

FIG. 4. Exchange field for Cr—Al/FeTaN bilayers as a function of antiferromagnetic layer thickness.

DETAILED DESCRIPTION OF THE INVENTION

A more complete appreciation of the invention and many of the attendant advantages thereof will be readily obtained as the same becomes better understood by reference to the following detailed description.

In the present spin valve device, a Cr-rich antiferromagnetic layer pins a magnetoresistive ferromagnetic layer by exchange coupling. The most common experimental observation characterizing exchange anisotropy is a hysteresis loop displaced along the field axis by H$_e$, the exchange field. The strength of the exchange coupling is expected[10, 11] to be H$_e$=J$_K$/M$_F$t$_F$ where J$_K$ is the exchange coupling energy and M$_F$ and t$_F$ are the saturation magnetization and thickness of the ferromagnet, respectively. The temperature dependence of H$_e$ generally varies as (1−T/T$_b$) where T$_b$ is the blocking temperature of the system[12]. T$_b$ is $\leq$T$_N$, where T$_N$ is the Néel temperature of the antiferromagnet.

The binary phase diagram of bulk Cr—Al alloys has been investigated by magnetic, microstructural, and crystallographic analyses[13]. Pure Cr is body-centered cubic (bcc) and antiferromagnetic with T$_N$=310 K. Al is soluble in Cr up to about 26 atomic percent (a/o) at room temperature and up to about 46 a/o at about 1620 K. The substitutional solid solution of Al in Cr is also bcc and antiferromagnetic and is denoted $\alpha$. The T$_N$ increases with Al content in the $\alpha$ phase to a maximum of 913 K at 26 a/o Al. The ordered $\beta$-Cr$_2$Al phase which forms below 1183 K is body-centered tetragonal (prototype: C11$_b$, MoSi$_2$) and antiferromagnetic. The $\beta$ phase has a solubility range from about 29 to about 35 a/o Al over which T$_N$ decreases from 703 K to 623 K. Separating $\alpha$ and $\beta$ is a narrow (26 to 29 a/o Al) two phase field ($\alpha$+$\beta$) which is also antiferromagnetic and over which T$_N$ decreases from 913K to 703K. The Cr—Al phase diagram has a low temperature Cr$_2$Al phase at 33 a/o Al. It is often observed that ordered tetragonal structures have large magnetic anisotropy constants. Annealed films in this composition range may be particularly useful.

The chromium content of the antiferromagnetic pinning layer may be 50–100 atomic percent (a/o). This range for the chromium content includes all specific values and subranges therebetween. Preferably, the chromium content is 100 to 54, more preferably 100 to 71 and, most preferably, 100 to 74 atomic percent.

The aluminum content in the pinning layer may be 0 to 50 a/o. This range for the aluminum content includes all specific values and subranges therebetween. Preferably, the aluminum content is 0 to 46, more preferably 0 to 29 and, most preferably, 0 to 26 atomic percent.

The antiferromagnetic layer may also contain other materials, provided that these additional components do not destroy the ability of the antiferromagnetic layer to pin the magnetoresistive ferromagnetic layer. Examples of these additional materials include non-metals (such as carbon, oxygen and nitrogen) and metals (such as Fe, Mn, Ag, Au, Co, Cu). Preferably, these materials are present as impurities. When present, they preferably comprise at most 5 a/o of the antiferromagnetic layer. Preferably, these materials are excluded from the pinning layer.

The thickness of the pinning layer may be 10–1000 Å. This thickness range for the pinning layer explicitly includes all specific values and subranges therebetween. Preferably, the pinning layer has a thickness of 100 to 700, more preferably 200 to 600 and, most preferably, 400 to 600 Å.

The magnetoresistive ferromagnetic layer of the present spin valve device may be any of the well known magnetoresistive metallic materials. Suitable, non-limiting examples of materials for the magnetoresistive ferromagnetic layer include $Ni_{80}Fe_{20}$ (permalloy), Co, $FeTa_{2.8}N_{1.5}$ and layers chosen in the fcc-range of the FeNiCo ternary alloy diagram.

The magnetoresistive ferromagnetic layer may have a thickness of 10–1000 Å. This thickness range for the pinned layer explicitly includes all specific values and subranges therebetween. Preferably, the pinning layer has a thickness of 50 to 700, more preferably 100 to 600 and, most preferably, 200 to 500 Å.

The ferromagnetic layer is pinned by the antiferromagnetic layer through exchange coupling. Exchange coupling is achieved by close proximity of the antiferromagnetic layer with the ferromagnetic layer. Preferably, these layers are in direct contact. The exchange field, $H_e$, may be at least 2 Oe, preferably at least 5 Oe, more preferably at least 10 Oe, even more preferably at least 15 Oe, and, most preferably, at least 20 Oe.

The degree of exchange coupling and the anisotropy constant will vary with the composition and thickness of the antiferromagnetic pinning layer and the magnetoresistive ferromagnetic layer. The critical thickness ($t_{cr}$) of the pinning layer may also vary with the composition of this layer. These properties may be determined for each spin valve using techniques well-known to those of skill in the art.

The spin valve device may contain additional antiferromagnetic pinning layers. These additional antiferromagnetic layer may have the same composition as the pinning layer described above. Alternatively, the additional pinning layers may be made of any materials known in the art for pinning magnetoresistive ferromagnetic layers. Suitable, non-limiting examples include FeMn, NiO and TbCo. Each of these additional pinning layers may pin an additional magnetoresistive ferromagnetic layer. In other words, each antiferromagnetic pinning layers in the present spin valve may pin a different magnetoresistive ferromagnetic layer. When the present device contains two or more pinned magnetoresistive ferromagnetic layers, these pinned layers may have the same or different chemical compositions. Preferably, there is at least one magnetoresistive ferromagnetic layer which is pinned solely by a Cr or Cr—Al pinning layer, i.e., there is no other pinning layer (such as FeMn) which is in contact with the magnetoresistive ferromagnetic layer.

The present device may also contain one or more magnetoresistive ferromagnetic layers which are not pinned by an antiferromagnetic layer, i.e., "free" layers. As discussed above, each of the magnetoresistive ferromagnetic layers in the spin valve device may have the same or a different chemical composition.

The present spin valve device may also contain one or more non-magnetic spacer layers. Examples of suitable spacer layers include Cu, Ag and Au layers, or mixtures of these metals. Cu is the more preferred material for the spacer layer. The thickness of the spacer layer may be 5–1000 Å. This thickness range explicitly includes all specific values and subranges therebetween. Preferably, the spacer layer has a thickness of 10 to 700, more preferably 20 to 500 and, most preferably, 50 to 100 Å. When the device additionally contains a free magnetoresistive ferromagnetic layer, a spacer is preferably incorporated between the free and pinned magnetoresistive layers.

The present spin valve device may also contain a substrate. Suitable examples of substrate layers include silicon, $SiO_2$, $Al_2O_3$, glass, diamond, $TiO_2$, ceramics, etc.

The device may have any of the well known spin valve configurations (see FIG. 1). The device may be a top spin valve, in which the antiferromagnetic pinning layer is on a substrate and the pinned magnetoresistive ferromagnetic layer is on the pinning layer. Alternatively, the positions of the pinning and pinned layers are reversed with respect to the top spin valve, i.e., a bottom spin valve. The device may be symmetrical with the layers in the order: substrate, first pinning layer, first pinned layer, first spacer layer, free ferromagnetic layer, second spacer layer, second pinned layer and second pinning layer. The present device may also have the interface engineered configuration. For a description of these configurations see J. C. S. Kools, "Exchange-Biased Spin Valves For Magnetic Storage", IEEE Transactions on Magnetics, Vol. 32, no. 4, July, 1996, p. 3168 and FIG. 3, incorporated herein by reference.

The spin valve device of the present invention may be fabricated by methods well-known to those of ordinary skill in the art. Examples include preparation by physical vapor deposition (PVD) methods. Suitable PVD methods include ion-beam sputtering (IBS), DC-magnetron sputtering, conventional RF-sputtering and molecular beam epitaxy (MBE). The unidirectional anisotropy of the spin valve is preferably set by using an aligning field during the deposition process. Large TN values are preferred in order to stabilize the antiferromagnetic phase.

Alternatively, the device may be prepared by magnetic annealing. Here, the spin valve structure is heated above the Néel temperature and cooled in a magnetic field to set the unidirectional anisotropy. For magnetic annealing of spin valve devices it is preferable that the Néel temperature is not too high during production where other components of the device could be damaged and not too low such that the antiferromagnetic state could be jeopardized. One interesting aspect of the Cr rich region of the Cr—Al phase diagram is that the Néel temperature may be tailored by controlling the Al content in the α phase field, as discussed above.

Having generally described this invention, a further understanding can be obtained by reference to certain specific examples which are provided herein for purposes of illustration only and are not intended to be limiting unless otherwise specified.

EXAMPLES

Example 1
Preparation of Cr—Al films

Cr—Al films were grown by DC magnetron sputtering at ambient temperature using a 4" diameter, pure (99–95%) Cr target fitted with 6 pieces of Al (99.9%) foil pasted symmetrically in the active sputtering region. The areal fraction of the Al foil was estimated (taking into account the different sputtering yields of Cr and Al) to give a film composition near Cr-15 a/o Al, i.e., toward the middle of the low temperature region of the α phase field. The composition of the film was determined by EDAX using a Philips XL30 SEM and was found to be uniform across the substrate. For samples grown at 3 mtorr Ar pressure and 300 W power, the sputtering rate was=19Å/sec and the composition was found to be 20 a/o Al. High angle X-ray diffraction of the Cr—Al films revealed a bcc structure with a lattice parameter of 2.92 Å. The measured lattice parameter of the film agreed well with the value expected from the measured composition when considering the bulk data of Koster[13].

Example 2
Preparation of a Spin valve Device

Figure 1A:
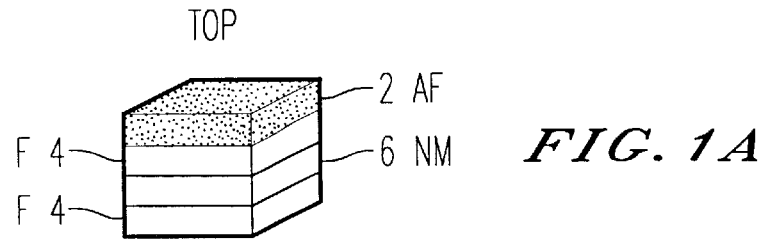
FIG. 1. Representative spin valve layouts. AF 2 represents an antiferromagnetic pinning layer; F 4 represents a magnetoresistive ferromagnetic layer.
Figure 1B:
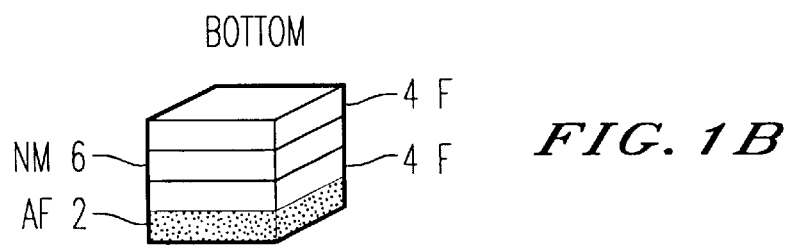
Figure 1C:
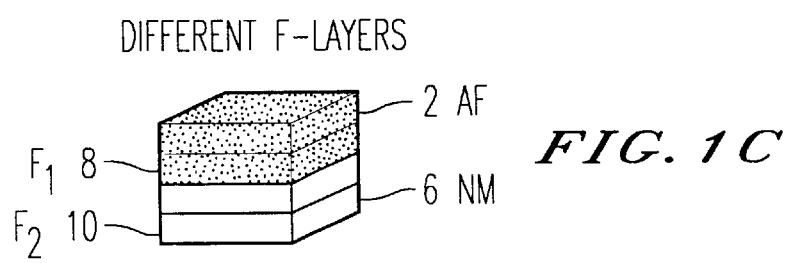
Figure 1D:
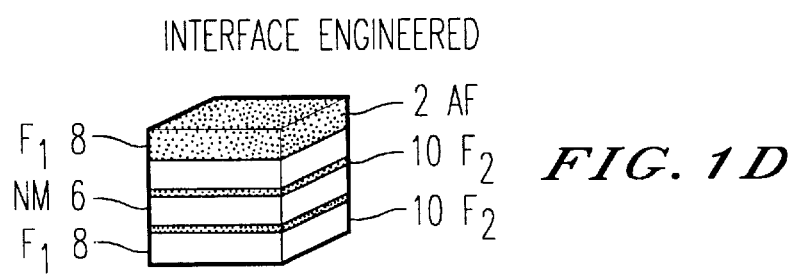
Figure 1E:
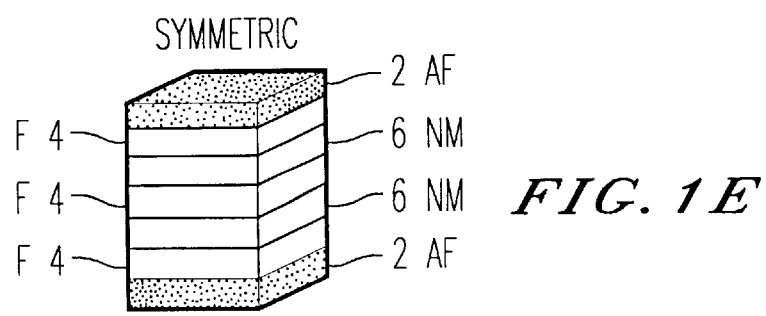
Figure 2A:
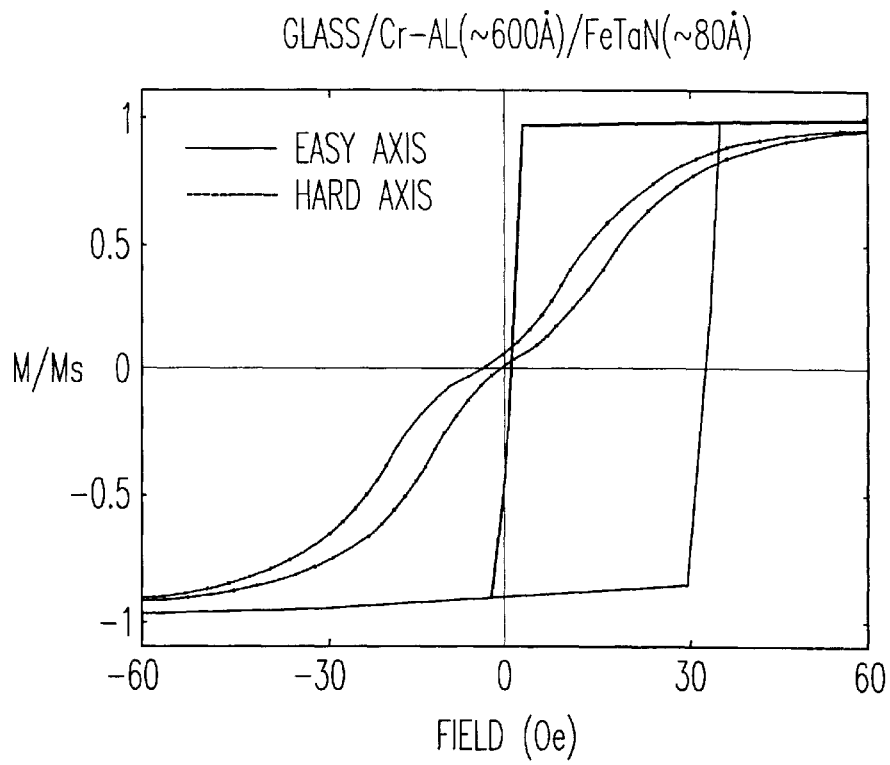
Figure 2B:
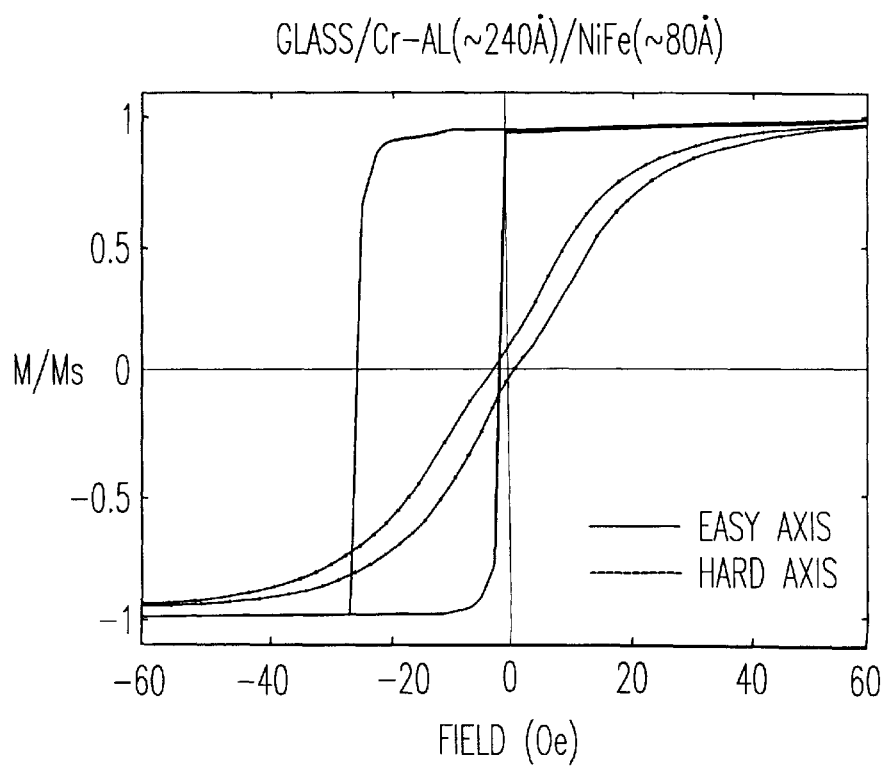

Ferromagnetic $FeTa_{2.8}N_{1.5}$ [14] or $Ni_{80}Fe_{20}$ [15], known for their soft magnetic properties, was deposited directly onto Cr—Al films which had been sputtered on glass substrates in an aligning magnetic field of 80 Oe. The FeTaN had a bcc structure while the NiFe had fcc structure. Loop tracer and VSM measurements on the bilayer configurations at room temperature were used to document exchange induced unidirectional anisotropy thus confirming antiferromagnetism in the Cr—Al layer. FIGS. 2a and 2b are hysteresis loops of the Cr—Al coupled with FeTaN and NiFe, respectively. The measurements were made along the easy axis (EA) and the hard axis (HA). A clear indication of unidirectional exchange anisotropy is seen in the easy axis loops of both FeTaN and NiFe. The largest exchange fields obtained in this study were 20 Oe. In all cases the coercivities were much larger than the usual coercivities obtained on single layer ferromagnetic films of the same composition and thickness, which is in agreement with other exchange coupled systems[16]. These larger coercivities compared to single layer films were also observed when the Cr—Al films are deposited on top of the ferromagnetic film. This deposition sequence had the advantage that the ferromagnetic films are identical in microstructure. The differences in $H_c$ must be due to an additional magnetic hardening increment caused by the ferromagnet/Cr—Al interface.

Example 3
Variation of Ferromagnetic layer and Cr—Al Layer Thickness

Figure 3A:
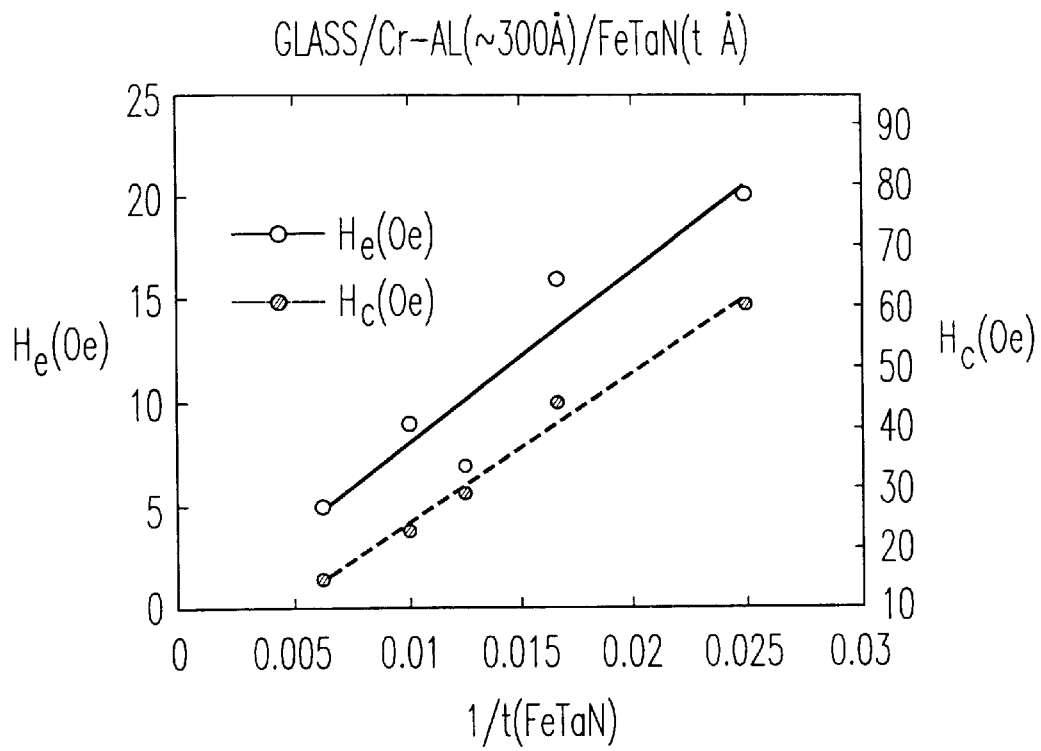
Figure 3B:
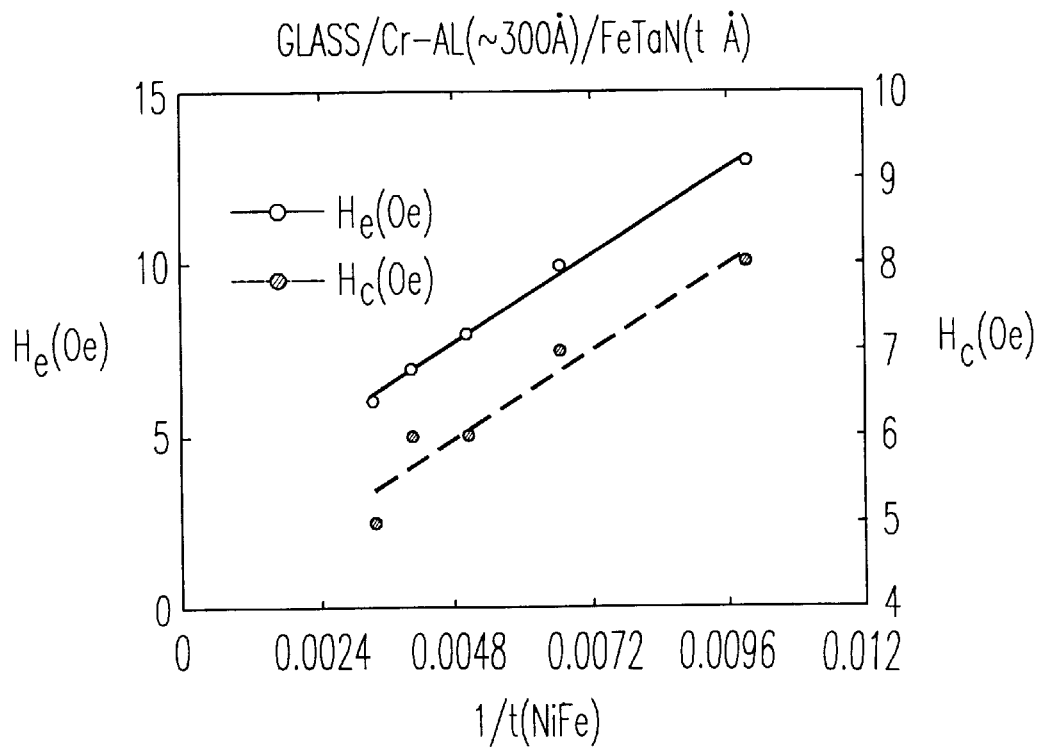

The thickness of the ferromagnetic layer and the Cr—Al layer was varied systematically. The variation of exchange field and coercivity with the inverse of ferromagnetic layer thickness is shown in FIGS. 3a and 3b for FeTaN and NiFe, respectively. A nearly $1/t_F$ dependence of $H_e$ and $H_c$ was observed for both FeTaN and NiFe. Since the exchange biasing effect is primarily an interface phenomenon, one expects $H_e$ to simply vary inversely with the thickness of the ferromagnetic film. The linear fits to the data were reasonably good and could be used to calculate the interfacial exchange coupling energy from $H_e = J_K / M_F t_F$ using $M_F = 1650$ emu/cc for FeTaN and $M_F = 780$ emu/cc for NiFe. The calculated value of $J_K = 0.01$ ergs/cm$^2$ was found to be the same for both ferromagnets coupled to the Cr—Al. This value should be compared with values obtained from other exchange coupled systems such as the oxides and FeMn, which typically have $J_K$ values in the range of 0.05 to 0.13 ergs/cm$^2$ while NiMn and TbCo have $J_K$ of approximately 0.25 ergs/cm$^2$[3, 17]. The small value Of $J_K$ obtained with Cr—Al compared to these other exchange coupled systems was not surprising since Cr—Al does not have high moment atoms (such as Ni, Fe or Co) in the structure. The $1/t_F$ dependence of $H_c$ and the relatively large values imply that the dominant domain wall pinning forces in the ferromagnetic layer are mostly located near the interface region between the ferromagnetic and the Cr—Al layer.

The exchange field of FeTaN coupled to Cr—Al is plotted against the Cr—Al thickness in FIG. 4. An onset of the coupling at a critical thickness of the AF layer was observed and with increasing thickness the exchange field seems to reach a plateau. According to Mauri et al[18], below a critical thickness ($t_{cr}$), the antiferromagnet will switch irreversibly with the ferromagnet leading to $H_e = 0$. It has been shown[18] that $t_{cr} = J_K / K_{AF}$ where $K_{AF}$ is the anisotropy constant of the antiferromagnet. Therefore, it is possible to estimate $K_{AF}$ from the relation $K_{AF} = H_e M_F (t_F / t_{cr})$ and the shape of the $H_e$ vs. $t_{AF}$ curve[18]. The value of $t_{cr}$ was taken at the midpoint along the increasing portion of the curve and $H_e$ was obtained from the plateau, i.e., $t_{cr} = 250$ Å and $H_e = 19$ Oe. This gave $K_{AF} = 1.07 \times 10^4$ ergs/cc for Cr—Al which is an order of magnitude smaller than the anisotropy constant calculated for FeMn ($K_{AF} = 1.35 \times 10^5$ ergs/cc) [18].

REFERENCES

1. W. H. Meiklejohn and C. P. Bean, Phys. Rev. 102, 1413–1415 (1956).
2. R. D. Hempstead, S. Krongelb, and D. A. Thompson, IEEE Trans. Magn. 14, 521–523 (1978).
3. J. C. S. Kools, IEEE Trans. Magn. 4,3165–3184 (1996).
4. B. Dieny, V. S. Speriosu, S. S. P. Parkin, et al, Phys. Rev. B 43, 1297 (1991).
5. M. J. Carey and A. E. Berkowitz, Appl. Phys. Lett. 60, 3060–3062 (1992).
6. T. Lin, D. Mauri, N. Staub, et al., Appl. Phys. Lett. 65, 1183–1185 (1994).
7. W. C. Cain, W. H. Meiklejohn, and M. H. Kryder, J. Appl. Phys. 61, 4170–4172 (1987).
8. J. S. Kasper and J. S. Kouvel, J. Phys. Chem. Solids 11, 231–238 (1959).
9. A. J. Devasahayam and M. H. Kryder, IEEE Trans. Magn. 32, 4654–4656 (1996).
10. A. P. Malozemoff, Phys. Rev. B 35, 3679–3682 (1987).
11. D. Mauri, H. C. Siegmann, P. S. Bagus, et al., J. Appl. Phys. 62, 3047–3049 (1987).
12. C. Tsang and K. Lee, J. Appl. Phys. 53, 2605–2607 (1982).
13. W. Koster, E. Wachtel, and K. Grube, Z. Metallkde. 54,393–401 (1963).
14. V. R. Inturi and J. A. Barnard, IEEE Trans. Magn. 31, 3952–3954 (1995).
15. R. M. Bozorth, Ferromagnetism (Van Nostrand, N.Y., 1951).
16. H. Fujiwara, M. R. Parker, K. Nishioka, et al, contribution to 2$^{nd}$ *International Symposium on Metallic Multilayers* (unpublished), Cambridge, U.K., 1995).
17. T. Lin, C. Tsang, R. E. Fontana, et al., IEEE Trans. Magn. 31, 2585–2590 (1995).
18. D. Mauri, E. Kay, D. Scholl, et al., J. Appl. Phys. 62, 2929–2932 (1987).

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A spin valve device, comprising:

an antiferromagnetic pinning layer, comprising chromium and aluminum; and a pinned first magnetoresistive ferromagnetic layer on said antiferromagnetic pinning layer.

2. The spin valve device of claim 1, further comprising a second magnetoresistive ferromagnetic layer on said pinned magnetoresistive ferromagnetic layer.

3. The spin valve device of claim 2, wherein said antiferromagnetic pinning layer comprises at most 50 atomic percent aluminum.

4. The spin valve device of claim 2, wherein said antiferromagnetic pinning layer comprises a Cr—Al alloy, wherein said alloy comprises at most 46 atomic percent aluminum.

5. The spin valve device of claim 4, wherein said Cr—Al alloy comprises at most 35 atomic percent aluminum.

6. The spin valve device of claim 4, wherein said Cr—Al alloy comprises at most 29 atomic percent aluminum.

7. The spin valve device of claim 4, wherein said Cr—Al alloy comprises at most 26 atomic percent aluminum.

8. The spin valve device of claim 4, wherein said antiferromagnetic pinning layer and said first magnetoresistive ferromagnetic layer are in direct contact.

9. The spin valve device of claim 4, wherein said first magnetoresistive ferromagnetic layer is pinned solely by said antiferromagnetic pinning layer.

10. The spin valve device of claim 2, further comprising a non-magnetic spacer layer, wherein said spacer layer is between said first magnetoresistive ferromagnetic layer and said second magnetoresistive ferromagnetic layer.

11. The spin valve device of claim 4, further comprising:

a pinned third magnetoresistive ferromagnetic layer on said second magnetoresistive ferromagnetic layer; and a second antiferromagnetic pinning layer.

12. The spin valve device of claim 4, further comprising a substrate.

13. A method of making the spin valve device of claim 1, comprising:

forming said antiferromagnetic pinning layer; and forming said first magnetoresistive ferromagnetic layer.

14. A spin valve device, comprising:

an antiferromagnetic pinning layer consisting essentially of chromium and aluminum; and a pinned first magnetoresistive ferromagnetic layer on said antiferromagnetic pinning layer.

15. The spin valve device of claim 14, further comprising a second magnetoresistive ferromagnetic layer on said first magnetoresistive ferromagnetic layer.

16. The spin valve device of claim 15, wherein said an antiferromagnetic pinning layer and said first magnetoresistive ferromagnetic layer are in direct contact.

17. The spin valve device of claim 15, wherein said first magnetoresistive ferromagnetic layer is pinned solely by said antiferromagnetic pinning layer.

18. A method of making the spin valve device of claim 14, comprising:

forming said antiferromagnetic pinning layer; and forming said first magnetoresistive ferromagnetic layer.

* * * * *